United States Patent
Furuta et al.

(10) Patent No.: US 8,009,484 B2
(45) Date of Patent: Aug. 30, 2011

(54) READ CIRCUIT AND READ METHOD

(75) Inventors: Masanori Furuta, Kanagawa (JP);
Daisuke Kurose, Kanagawa (JP);
Tsutomu Sugawara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 183 days.

(21) Appl. No.: 12/547,945

(22) Filed: Aug. 26, 2009

(65) Prior Publication Data

US 2010/0054034 A1    Mar. 4, 2010

(30) Foreign Application Priority Data

Aug. 28, 2008   (JP) .................................. 2008-220094

(51) Int. Cl.
*G11C 7/10* (2006.01)
*G11C 11/00* (2006.01)
(52) U.S. Cl. .................................. 365/189.04; 365/201
(58) Field of Classification Search ............. 365/189.04, 365/201, 189.05, 158
See application file for complete search history.

(56) References Cited

U.S. PATENT DOCUMENTS

| 4,369,501 | A  | * | 1/1983  | Brown et al. ........................ 365/8 |
| 6,826,094 | B1 | * | 11/2004 | Perner et al. ............. 365/189.07 |
| 6,842,366 | B2 |   | 1/2005  | Tanizaki et al. ................ 365/171 |
| 7,102,945 | B2 | * | 9/2006  | Tsuchida et al. ............... 365/205 |
| 7,532,498 | B2 | * | 5/2009  | Chow et al. ..................... 365/145 |
| 2009/0219753 | A1 |   | 9/2009  | Nozawa et al. ................ 365/158 |
| 2009/0219757 | A1 |   | 9/2009  | Furuta et al. ................... 365/171 |
| 2009/0237988 | A1 |   | 9/2009  | Kurose et al. .................. 365/171 |

* cited by examiner

*Primary Examiner* — Anh Phung
(74) *Attorney, Agent, or Firm* — Ohlandt, Greeley, Ruggiero & Perle, L.L.P.

(57) ABSTRACT

In a read circuit, a write circuit writes a data to be stored and/or a test data to the memory cell. A control circuit controls the write circuit to write the test data to the memory cell in a first phase, and to write the test data which is same as the first phase to the memory cell in a second phase. An integrator integrates voltages at one terminal of the memory cell during the first phase to obtain a first integrated voltage, and integrates voltages at one terminal of the memory cell during the second phase to obtain a second integrated voltage. A buffer stores the first integrated voltage. A comparator compares the first integrated voltage from the buffer with the second integrated voltage from the integrator to obtain the data.

8 Claims, 6 Drawing Sheets

READ CIRCUIT AND READ METHOD

CROSS REFERENCE TO RELATED APPLICATIONS

This application is based upon and claims the benefit of priority from the Japanese Patent Application No. 2008-220094, filed on Aug. 28, 2008, the entire contents of which are incorporated herein by reference.

BACKGROUND OF THE INVENTION

1. Field of the Invention

The present invention relates to a read circuit, and read method.

2. Description of the Related Art

Recently, a MRAM (Magnetoresistive Random Access Memory) is widely studied as a memory storage, since it can be rewritable many times and it has a fast access time. In the MRAM, many memory cells are located in a matrix by bit lines and word lines. Each memory cell exists at an intersection of the bit line and the word line, and stores a data with 1 bit.

Each memory cell includes a magnetoresistive element which is called as MTJ (Magnetic Tunneling Junction) and a transistor which is called a MOSFET (Metal-Oxide-Semiconductor Field-Effect Transistor) for selecting a memory cell. One terminal of the MTJ is connected to a drain terminal of MOSFET. The other terminal of the MTJ is connected to the bit line. The gate terminal of the MOSFET is connected to the word line, and the source terminal of the MOSFET is connected to a ground. The resistance value of the MTJ depends on the data stored in the memory cell. For example, $R\_0$, which is the resistance value of the MTJ when the data is "0", is smaller than $R\_1$ which is the resistance value of the MTJ when the data is "1".

The data stored in the memory cell is read by turning on the MOSFET through the word line and measuring an electric current through the MTJ. It is determined whether the data is "0" or "1" based on the electric current through the MTJ, since the bit line is connected to a constant-voltage circuit. In the above example, $I\_0$, which is the electric current through the MTJ when the data is "0", is bigger than $I\_1$ which is the electric current through the MTJ when the data is "1", because $R\_0$ is smaller than $R\_1$. Therefore, in a conventional read circuit, the data is read by comparing the electric current through the MTJ in each memory cell with a predetermined threshold.

However, the conventional read circuit does not consider variation of the resistance value among the MTJs. Although $R\_0$ is determined to be smaller than $R\_1$ for all MTJs, $R\_0$ of a MTJ could be larger than $R\_1$ of another MTJ because of the variation of the resistance value among MTJs. Therefore, the conventional read circuit could read incorrect data, since the predetermined threshold is common for all MTJs. As a result, a bit error is caused in the data which is read from the memory cell.

On the other hand, the $R\_0$ and $R\_1$ in an individual MTJ have more than twice difference each other. Self-reference read method using the difference of the $R\_0$ and $R\_1$ in each MTJ is attended.

One of the self-reference read methods is disclosed in U.S. Pat. No. 6,842,355. This method includes four phases described below; (1) read a data from a memory cell, (2) write a test data "0" (or "1") to the memory cell, (3) read the test data from the memory cell, (4) write the data read in (1) to the memory cell. When the data read in (1) is nearly equal to the test data read in (3), the data may be same as the test data. On the other hand, when the data read in (1) is different from the test data read in (3), the data may be different from the test data. Since the threshold which is common for all MTJs is not used in the self-reference read method, the bit error due to the variation of the resistance value among MTJs does not occur.

However, the self-reference read method is not fast to read the data, since it includes four phases. Moreover, size of the MRAM is large, since the read circuit is complex to perform the four phases.

SUMMARY OF THE INVENTION

According to one aspect of the invention, a read circuit for reading a data from a memory cell includes:
a write circuit to write the data to be stored and/or a test data to the memory cell;
a control circuit which controls the write circuit to write the test data to the memory cell in a first phase, and to write the test data which is same as the first phase to the memory cell in a second phase;
an integrator which integrates voltages at one terminal of the memory cell during the first phase to obtain a first integrated voltage, and integrates voltages at one terminal of the memory cell during the second phase to obtain a second integrated voltage;
a buffer to store the first integrated voltage; and
a comparator which compares the first integrated voltage from the buffer with the second integrated voltage from the integrator to obtain the data.

DETAILED DESCRIPTION OF THE INVENTION

The embodiments will be explained with reference to the accompanying drawings.

Description of the First Embodiment

Figure 1:
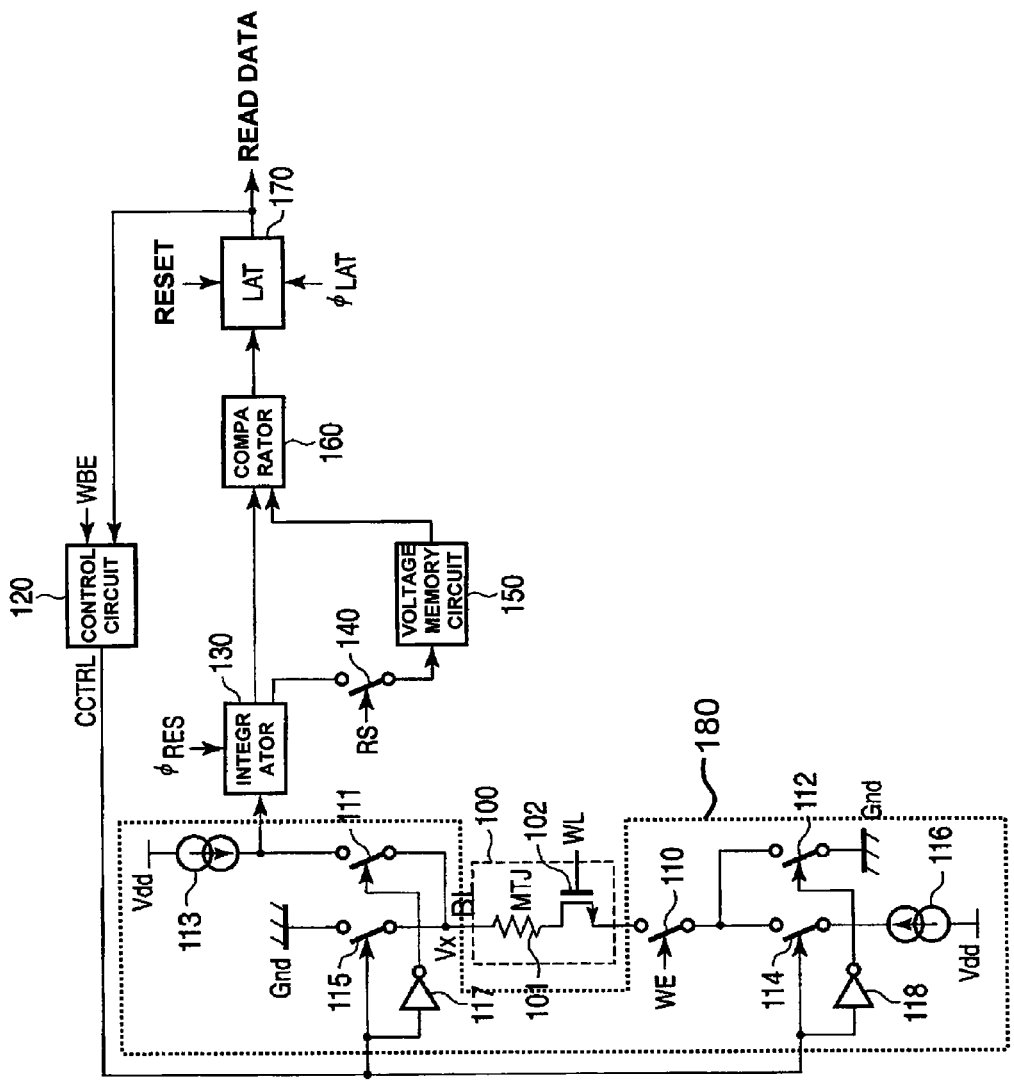
FIG. 1 is a block diagram showing a read circuit according to the first embodiment.

In FIG. 1, a read circuit reads a data stored in a memory cell 100 of the MRAM. The read circuit includes switches 110, 111, 112, 114, 115, and 140, constant current sources 113 and 116, NOT gates (inverters) 117 and 118, a control circuit 120, an integrator 130, a voltage memory circuit 150, a comparator 160, and a latch circuit 170.

The memory cell 100 includes a MTJ 101 and a MOS transistor 102 for selecting the memory cell. One terminal of the MTJ 101 is connected to a bit line (BL). The other terminal of the MTJ is connected to a drain terminal of the MOS transistor 102. The gate terminal of the MOS transistor 102 is connected to a word line (WL), and the source terminal of the MOS transistor is connected to the switch 110 which is turned on/off based on a control signal WE from external. The switch 110 is keeping on while the read circuit reads the data from the memory cell 100. Otherwise, the switch 110 is turning off.

In FIG. 1, the memory cell 100 and the read circuit make a pair. However, several memory cells may share one read circuit by selecting one of the memory cells to read.

A control signal CCTRL from the control circuit 120 is input into the switches 114, 115. An inversion signal of the control signal CCTRL is input into the switches 111, 112 through the NOT gates 117, 118, respectively. Therefore, the pair of switches 111, 112 and the pair of switches 114, 115 are alternately turning on/off each other. The constant current sources 113, 116 supply an electric current in order to write a data to the memory cell 100.

The read circuit also performs writing a data to the memory cell 100 using spin injection. The switches 110, 111, 112, 114, 115, the constant current sources 113 and 116, the NOT gates 117 and 118 provide a write circuit 180. While the switches 111, 112 are turned on, an electric current follows through the MTJ 101 from the constant current source 113, and the data "1" is written to the memory cell 100. On the other hand, while the switches 114, 115 are turned on, an electric current follows through the MTJ 101 from the constant current source 116, and the data "0" is written to the memory cell 100. Moreover, in the first embodiment, R_0, which is the resistance value of the MTJ 101 when the data is "0", is smaller than R_1 which is the resistance value of the MTJ 101 when the data is "1".

The control circuit 120 performs a given calculation using a control signal WBE from external and an output signal from the latch circuit 170 to obtain the control signal CCTRL. As mentioned above, the control signal CCTRL is used to switch writing a data "0" or "1" to the memory cell 100.

The read circuit performs three phases to read a data stored in the memory cell 100. The first phase is that writing a test data "1" (or "0") to the memory cell 100 and integrating voltages Vx at one terminal of the MTJ 101 in a time domain during the first phase (hereinafter, referred to as "first integrated voltage").

The second phase is that writing the test data "1" (or "0") again to the memory cell 100 and integrating voltages Vx at one terminal of the MTJ 101 in a time domain during the second phase (hereinafter, referred to as "second integrated voltage"). Moreover, the second phase is that comparing the first integrated voltage with the second integrated voltage in order to determine whether the data stored in the memory cell 100 is "0" or "1" to be a read data.

The third phase is that writing the read data back to the memory cell 100 to recover the data to that before writing the test data. In the first and second phases, the integrator 130 integrates voltages Vx at one terminal of the MTJ 101 to obtain the first and second integrated voltages. Moreover, the integrator 130 is reset by a control signal φRES from external rising up to "high" when the first and the second phases start.

The switch 140 is controlled according to a control signal RS from external. The switch 140 is being turned on during the first phase, and turned off in the other phases. The voltage memory circuit 150 is connected to the integrator 130 through the switch 140. The voltage memory circuit 150 memorizes the first integrated voltage which is indicated from the integrator 130.

The comparator 160 is connected to the integrator 130 and the voltage memory circuit 150. When the second phase ends, the integrator 130 inputs the second integrated voltage into the comparator 160. Simultaneously, the voltage memory circuit 150 inputs the first integrated voltage into the comparator 160. The comparator 160 compares the first integrated voltage with the second integrated voltage. When the first integrated voltage is smaller than the second integrated voltage, the comparator 160 outputs "0" to the latch circuit 170. On the other hand, when the first integrated voltage is equal to or larger than the second integrated voltage, the comparator 160 outputs "1" to the latch circuit 170.

The latch circuit 170 is controlled according to a control signal φLAT from external and a control signal RESET from external. The latch circuit 170 holds the output signal from the comparator 160 since the control signal φLAT rises up to "high" until the control signal RESET rises up to "high". Also, the latch circuit 170 continues to output the input signal as an output signal to the control circuit 120 since the control signal φLAT rises up to "high" until the control signal RESET rises up to "high". When the control signal RESET rises up to "high", the latch circuit 170 is reset. The output signal from the latch circuit 170 is a read data stored in the memory cell 100.

Hereinafter, we explain each phase. In the first phase, the read circuit writes the test data "1" to the memory cell 100. In the first embodiment, although the test data is "1", it can be "0". The first phase is shown as "Hi Write(1)" in FIG. 2. When the first phase starts, the control signals WE, RS, and φRES rise up to "high". Since the switch 110 is turned on by the control signal WE rising up to "high" and the switches 111 and 112 are turned on by the control signal CCTRL keeping "low", the test data "1" is written to the memory cell 100 by the constant current source 113.

The integrator 130 integrates voltages Vx at one terminal of the memory cell 100 during writing the test data "1" to obtain the first integrated voltage. Since the switch 140 is turned on by the control signal RS rising up to "high", the voltage memory circuit 150 continues to update the first integrated voltage from the integrator 130 during the control signal RS keeping "high". Moreover, the integrator 130 is reset by the control signal φRES rising up to "high".

In the second phase, the read circuit writes the test data "1" to the memory cell 100 as same as the first phase. The second phase is shown as "Hi Write(2)" in FIG. 2. In the first embodiment, the length of the second phase is equal to that of the first phase. The each length of the first and second phases depends on the conditions of manufacturing the MRAM. For example, the each length of the first and second phases may be several dozen [nsec], which is including a margin time to avoid write error.

When the second phase starts, the control signal RS drops down to "low" and the control signal φRES rises up to "high". Since the switch 110 remains "on" by the control signal WE keeping "high" and the switches 111 and 112 also remain "on", the test data "1" is written to the memory cell 100 by the constant current source 113.

The integrator 130 integrates voltages Vx at one terminal of the memory cell 100 during writing the test data "1" to obtain the second integrated voltage. Since the switch 140 is turned off by the control signal RS dropping down to "low", the integrator 130 and the voltage memory circuit 150 are unconnected. Therefore, the integrator 130 inputs the second integrated voltage into the comparator 160. On the other hand, the first integrated voltage memorized in the voltage memory circuit 150 is also input into the comparator 160. The comparator 160 compares the first integrated voltage with the second integrated voltage. When the first integrated voltage is smaller than the second integrated voltage, the comparator 160 outputs "0" to the latch circuit 170. On the other hand, when the first integrated voltage is equal to or larger than the second integrated voltage, the comparator 160 outputs "1" to the latch circuit 170. The integrator 130 is reset by the control signal φRES rising up to "high".

When the second phase ends, the control signal φLAT rises up to "high". Then, the latch circuit 170 holds the output signal from the comparator 160, and the latch circuit 170 outputs the output signal as the read data of the memory cell 100.

In the third phase, the read circuit writes the read data back to the memory cell 100. The third phase is shown as "Write Back" in FIG. 2. Since the test data "1" is written to the memory cell 100 in the second phase, it is needed to write the data "0" back to the memory cell 100, if the read data is "0". The third phase is optional and may be skipped if the read data is "1".

When the third phase starts, the control signal WBE rises up to "high". The output signal from the latch circuit 170 is input into the control circuit 120. The output signal from the latch circuit 170 equals to the read data of the memory cell 100. Since R_0 is smaller than R_1, the read data is "0" when the first integrated voltage is smaller than the second integrated voltage. On the other hand, the read data is "1" when the first integrated voltage is equal to or larger than the second integrated voltage. When the read data is "0", the control circuit 120 outputs "1" as the control signal CCTRL. Therefore, the switches 114, 115 are turned on, and the data "0" is written to the memory cell 100 by the constant current source 116. As a result, the data in the memory cell 100 is recovered to the original data before writing the test data.

Figure 2:
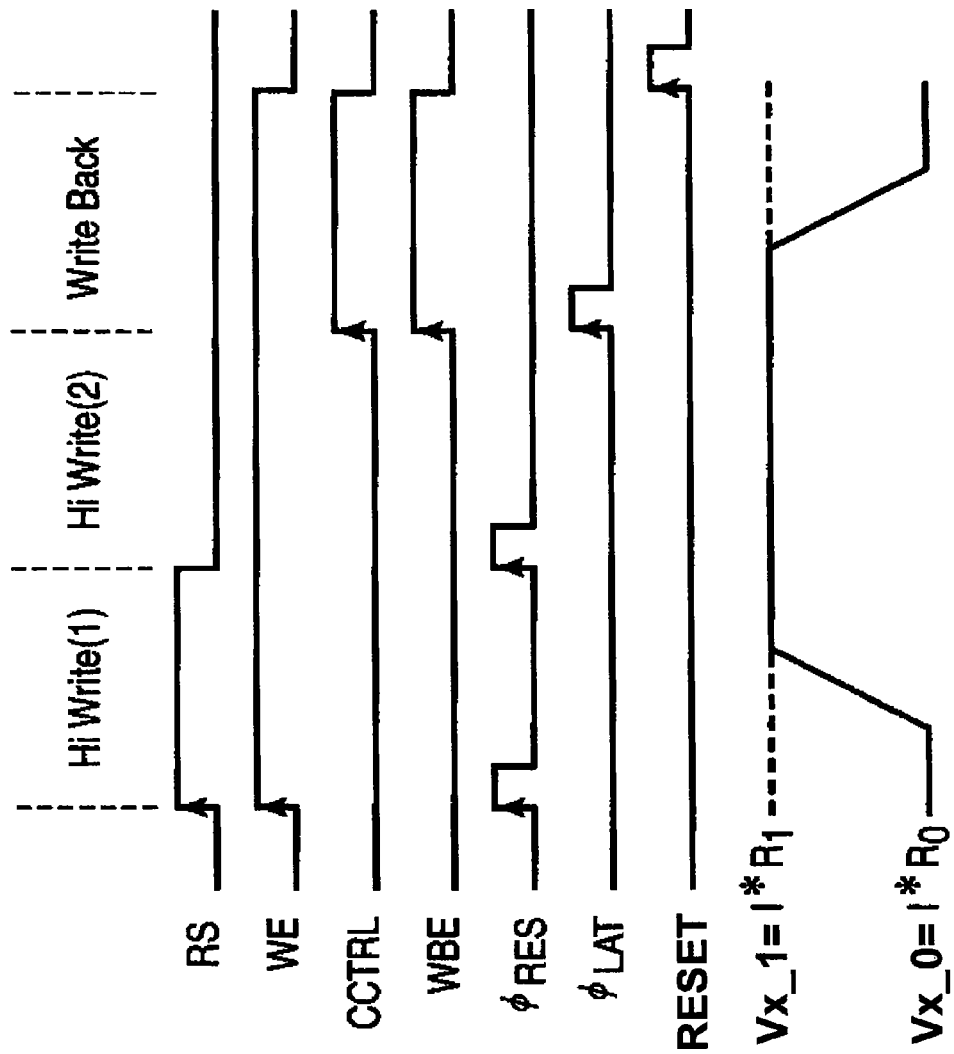
FIG. 2 is a timing chart of the read circuit shown in FIG. 1.

Hereinafter, the self-reference read method which is realized by the first and second phases is explained. In the first phase, the test data "1" is written to the memory cell 100. If the original data is "0", the resistance value of the MTJ increases from R_0 to R_1 by writing the test data "1" during the first phase, since R_1 is larger than R_0. When the read circuit writes a data to the memory cell 100, constant electricity I follows through the MTJ 101 from the constant current source 113 or 116. Therefore, the voltage Vx at the one terminal of the memory cell 100 varies depending on the resistance value of the MTJ 101 as shown in FIG. 2. Since R_1 is almost twice of R_0, the voltage Vx_1 (=I*R_1) when the data is "1" becomes almost twice of the voltage Vx_0 (=I*R_0) when the data is "0".

On the other hand, if the original data is "1", the resistance value of the MTJ 101 keeps constant as R_1. Therefore, the voltage Vx_1 (=I*R_1) of the one terminal of the memory cell 100 is always constant as shown in FIG. 2.

In the second phase, the test data "1" remains to be written to the memory cell 100 following the first phase. Since the resistance value of the MTJ 101 remains to be R_1, the voltage Vx_1 (=I*R_1) is also constant during the second phase.

As shown in FIG. 2, when the data stored in the memory cell 100 is "0", the first integrated voltage is smaller than the second integrated voltage. On the other hand, when the data stored in the memory cell 100 is "1", the first integrated voltage is equal to the second integrated voltage. Therefore, the read data can be obtained by comparing the first integrated voltage with the second integrated voltage.

Although the voltage Vx_0 (=I*R_0) varies linearly in FIG. 2, it actually varies non-linearly. Moreover, a time which is taken to vary the voltage Vx from Vx_0 to Vx_1 is not fixed. However, the difference between the first and second integrated voltages is clearly visible. Therefore, it is no problem to read the data from memory cell 100.

According to the first embodiment, the read circuit writes a test data "1" (or "0") to the memory cell 100 in the first phase, and writes the test data "1" (or "0") again in the second phase. Then, the read circuit obtains the original data stored in the memory cell 100 by comparing the first and second integrated voltages. Since the read circuit reads the data with two phases (or maximum three phases), the read circuit can read the data faster than the conventional self-reference read circuit which reads the data with four phases.

Moreover, the read circuit can share a part of the circuit with a write circuit using spin injection. Therefore, the read circuit achieves small size of the MRAM.

Description of the Second Embodiment

Figure 3:
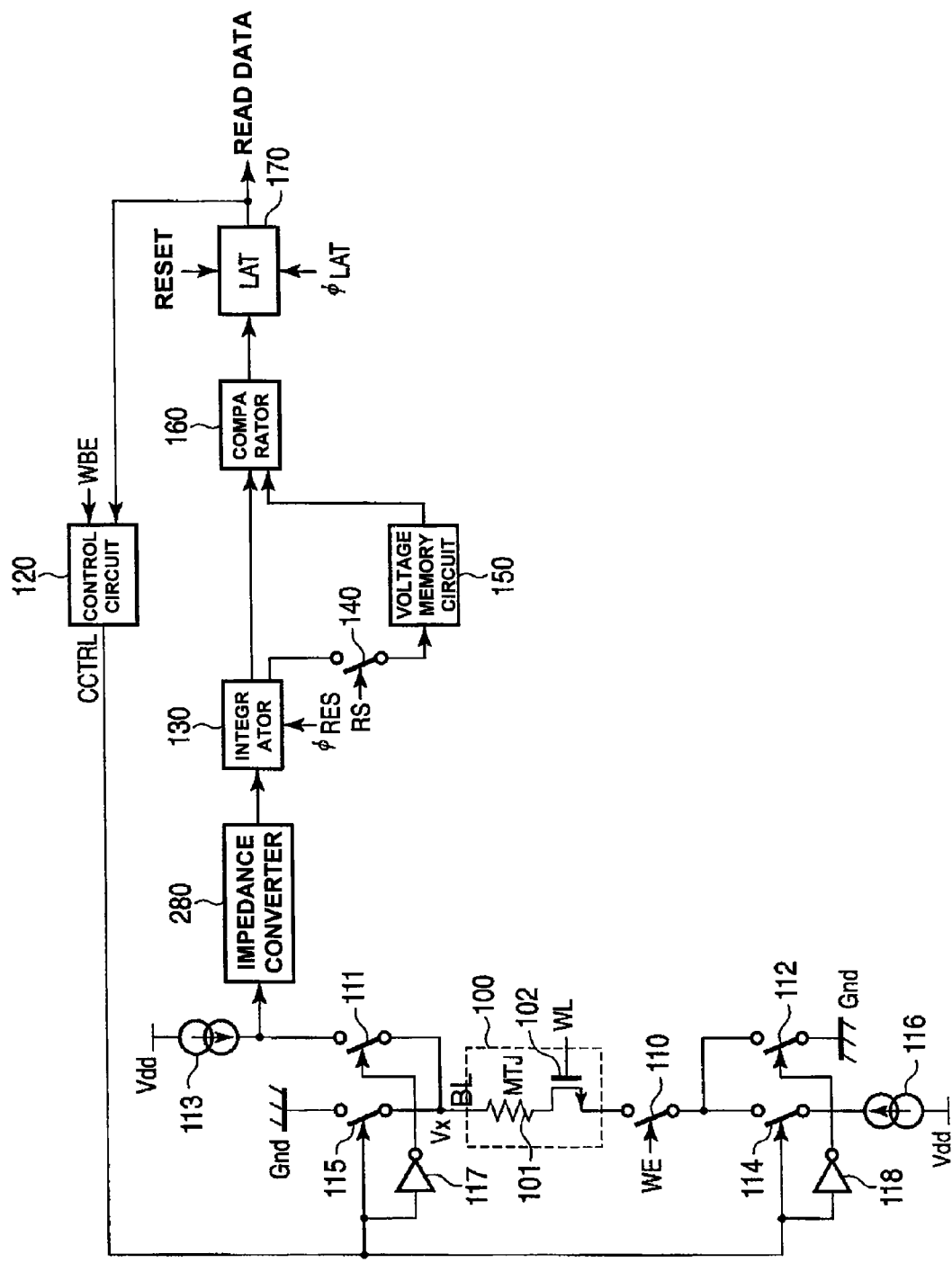
FIG. 3 is a block diagram showing a read circuit according to the second embodiment.

As shown in FIG. 3, the read circuit in the second embodiment is same as that in the first embodiment, except that an impedance converter 280 is added. Therefore, we will mainly explain the impedance converter 280 below. The impedance converter 280 is one of the attenuator circuits including transistor to attenuate an electric current.

The impedance converter 280 is inserted between the constant current source 113 and the integrator 130. The impedance converter 280 has high input impedance and low output impedance.

In the read circuit of the first embodiment, the electric current from the constant current sources 113 could be split to the memory cell 100 and to the integrator 130, when the input impedance of the integrator 130 is small. This means the electricity current to the memory cell 100 is not enough to write a data. As a result, it may fail to write the data to the memory cell 100.

The higher input impedance of the impedance converter 280 leads to less split flow and fewer write error. The input impedance of the impedance converter 280 is determined using R_0, R_1, acceptable error of the comparator 160, and acceptable error of the voltage memory circuit 150.

The output impedance of the impedance converter 280 had better be enough smaller than the input impedance of the integrator 130. Moreover, the impedance converter 280 had better have short delay because the delay may cause read error in the comparator 160.

According to the second embodiment, the amount of the split flow from the constant current sources 113 to the integrator 130 is reduced by inserting the impedance converter 280 with high input impedance and low output impedance. Therefore, the read circuit achieves fewer write error to the memory cell 100.

Description of the Third Embodiment

Figure 4:
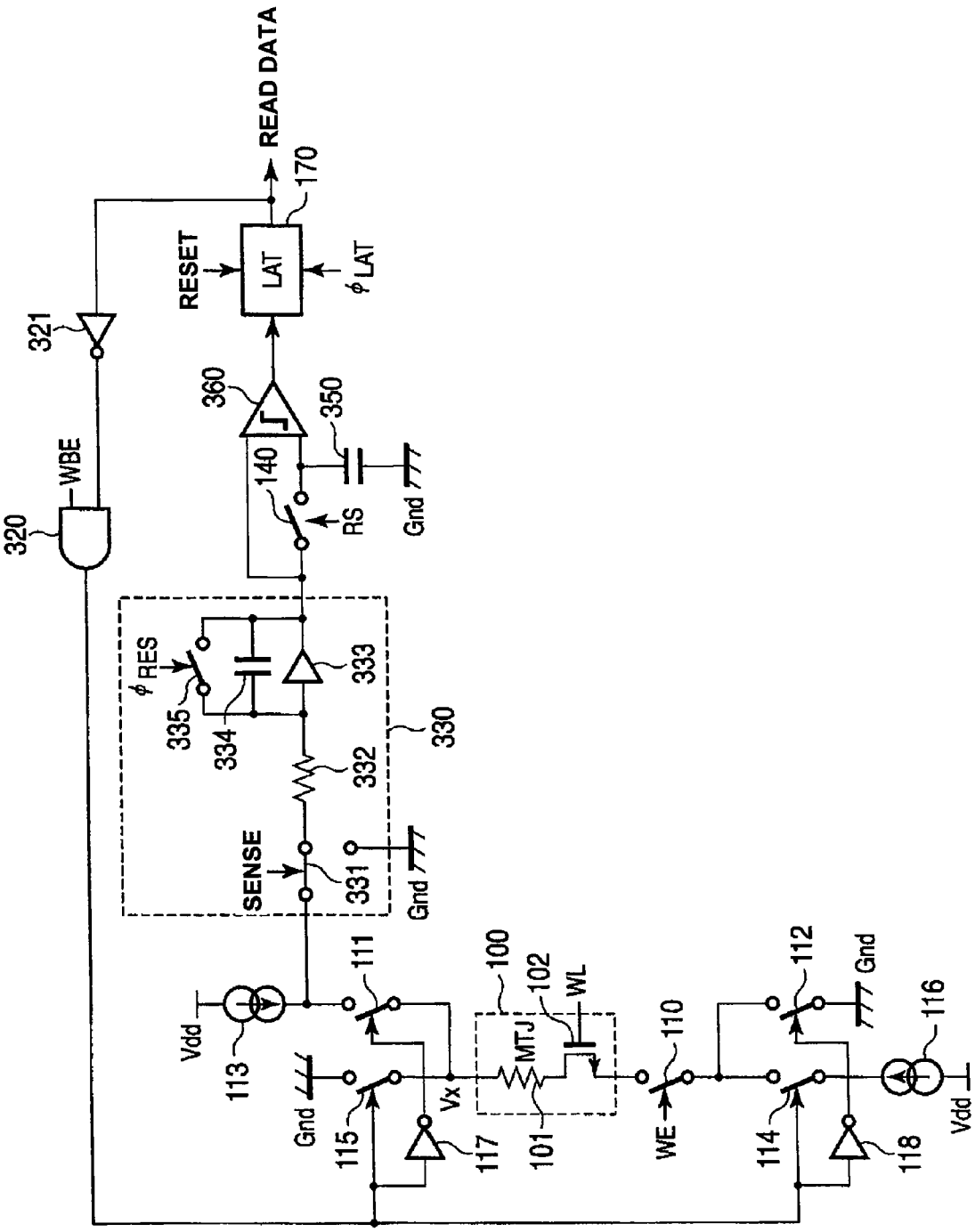
FIG. 4 is a block diagram showing a read circuit according to the third embodiment.

In FIG. 4, a read circuit reads a data stored in a memory cell 100 of the MRAM. The read circuit includes switches 110, 111, 112, 114, 115, and 140, constant current sources 113 and 116, NOT gates (inverters) 117 and 118, a control circuit 320, an integrator 330, a capacitor 350, a comparator 360, and a latch circuit 170. The switches 110, 111, 112, 114, 115, and 140, the constant current sources 113 and 116, the NOT gates (inverters) 117 and 118, and the latch circuit 170 are same as the first embodiment. Therefore, these explanations are skipped. On the other hand, the control circuit 320, the integrator 330, the capacitor 350, and the comparator 360 are different from the first embodiment. Therefore, we will explain these components below. Moreover, the read circuit performs three phases to read a data stored in the memory cell 100. The first to third phases are same as the first embodiment.

The control circuit 320 performs a given calculation using a control signal WBE from external and an output signal from the latch circuit 170 to obtain a control signal CCTRL. The given calculation may be an AND operation of the control signal WBE and a signal which is inverted the output signal from the latch circuit 170 by the NOT gate 321.

The integrator 330 integrates voltages Vx at one terminal of the MTJ 101 to obtain the first and second integrated voltages in the first and second phases. The first and second integrated voltages are same as them in the first embodiment.

Moreover, the integrator 330 is reset by a control signal φRES from external rising up to "high" when the first and the second phases start.

The integrator 330 includes a switch 331 and 335, a resistor 332, an operational amplifier 333, and a capacitor 334. The switch 331 is controlled by a control signal SENSE from external. One terminal of the switch 331 is connected to the resistor 332. The other terminal of the switch 331 is connected to the memory cell 100 through the switch 111 or to ground according to the control signal SENSE. In the first and second phases, the other terminal of the switch 331 is connected to the memory cell 100 through the switch 111. Otherwise, the other terminal of the switch 331 is connected to ground. The switch 331 controls performing/stopping integrating the voltages Vx in the integrator 330.

The resistor 332 converts the voltage Vx to an electric current to charge the capacitor 334. One terminal of the resistor 332 is connected to the switch 331. The other terminal of the resistor 332 is connected to the connection point of an input terminal of the operational amplifier 333, one terminal of the capacitor 334, and one terminal of the switch 335. Both terminals of the operational amplifier 333 are connected each other through the capacitor 334. The operational amplifier 333 outputs the first integrated voltage in the first phase and the second integrated voltage in the second phase.

The capacitor 334 is charged by the electric current which is converted from the input voltage Vx by the resistor 332. Both terminals of the capacitor 334 are connected to terminals of the switch 335, respectively. The switch 335 is controlled by a control signal φRES from external. When the control signal φRES rises up to "high", the switch 335 is turned on. Therefore, the both terminals of the capacitor 334 are connected each other and the charged electricity in the capacitor 334 is released. As a result, the integrator 330 is reset.

One terminal of the capacitor 350 is connected to the connection point of an input terminal of the comparator 360 and an output terminal of the integrator 330 through the switch 140. The other terminal of the capacitor 350 is connected to ground. The capacitor 350 memorizes the first integrated voltage as same as the voltage memory circuit 150 in the first embodiment. The switch 140 and the capacitor 350 provide for a sample-and-hold circuit. The capacitor 350 samples the first integrated voltage in the first phase and holds the sampled first integrated voltage in other phases.

The comparator 360 is connected to the capacitor 350 and the integrator 330. The comparator 360 compares the first integrated voltage from the capacitor 350 with the second integrated voltage from the integrator 330. When the first integrated voltage is smaller than the second integrated voltage, the comparator 360 outputs "0" to the latch circuit 170. On the other hand, when the first integrated voltage is equal to or larger than the second integrated voltage, the comparator 360 outputs "1" to the latch circuit 170. The comparator 360 may be a hysteresis comparator as shown in FIG. 4.

Figure 5:
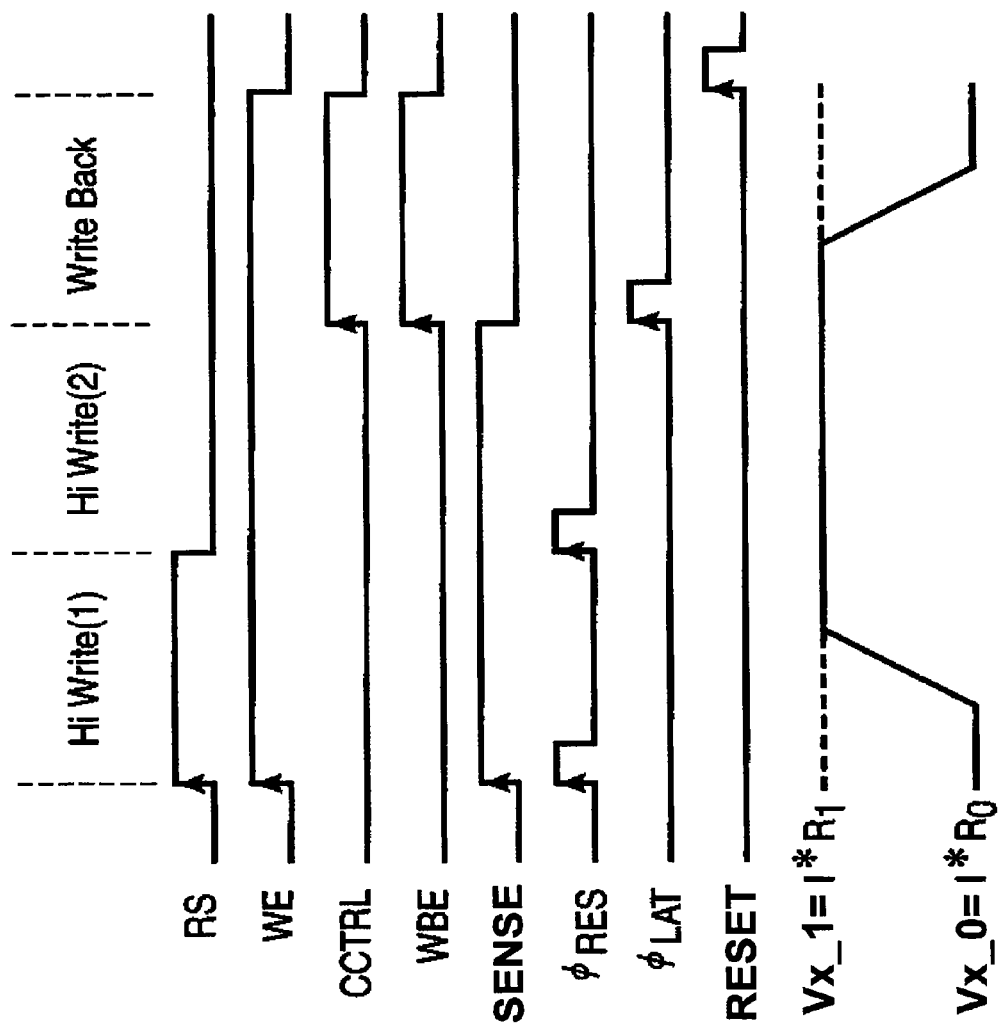
FIG. 5 is a timing chart of the read circuit shown in FIG. 4.

The timing chart of the read circuit in the third embodiment shown in FIG. 5 is same as that in the first embodiment shown in FIG. 2, except the control signal SENSE. Therefore, we will mainly explain the control signal SENSE below.

The control signal SENSE rises up to "high" when the first phase starts, and keeps "high" during the first and second phases. When the control signal SENSE is "high", the switch 331 is connected to the memory cell 100 through the switch 111. Therefore, the integrator 330 integrates the voltages Vx during the first and second phases. On the other hand, the control signal SENSE drops down to "low" when the third phase starts. When the control signal SENSE is "low", the switch 331 is connected to ground. Therefore, the integrator 330 is unconnected with the memory cell 100 and does not integrate the voltages Vx during the third phase.

According to the third embodiment, the read circuit writes a test data "1" (or "0") to the memory cell 100 in the first phase, and writes the test data "1" (or "0") again in the second phase. Then, the read circuit obtains the original data stored in the memory cell 100 by comparing the first and second integrated voltages. Since the read circuit reads the data with two phases (or maximum three phases), the read circuit can read the data faster than the conventional self-reference read circuit which reads the data with four phases.

Description of the Fourth Embodiment

Figure 6:
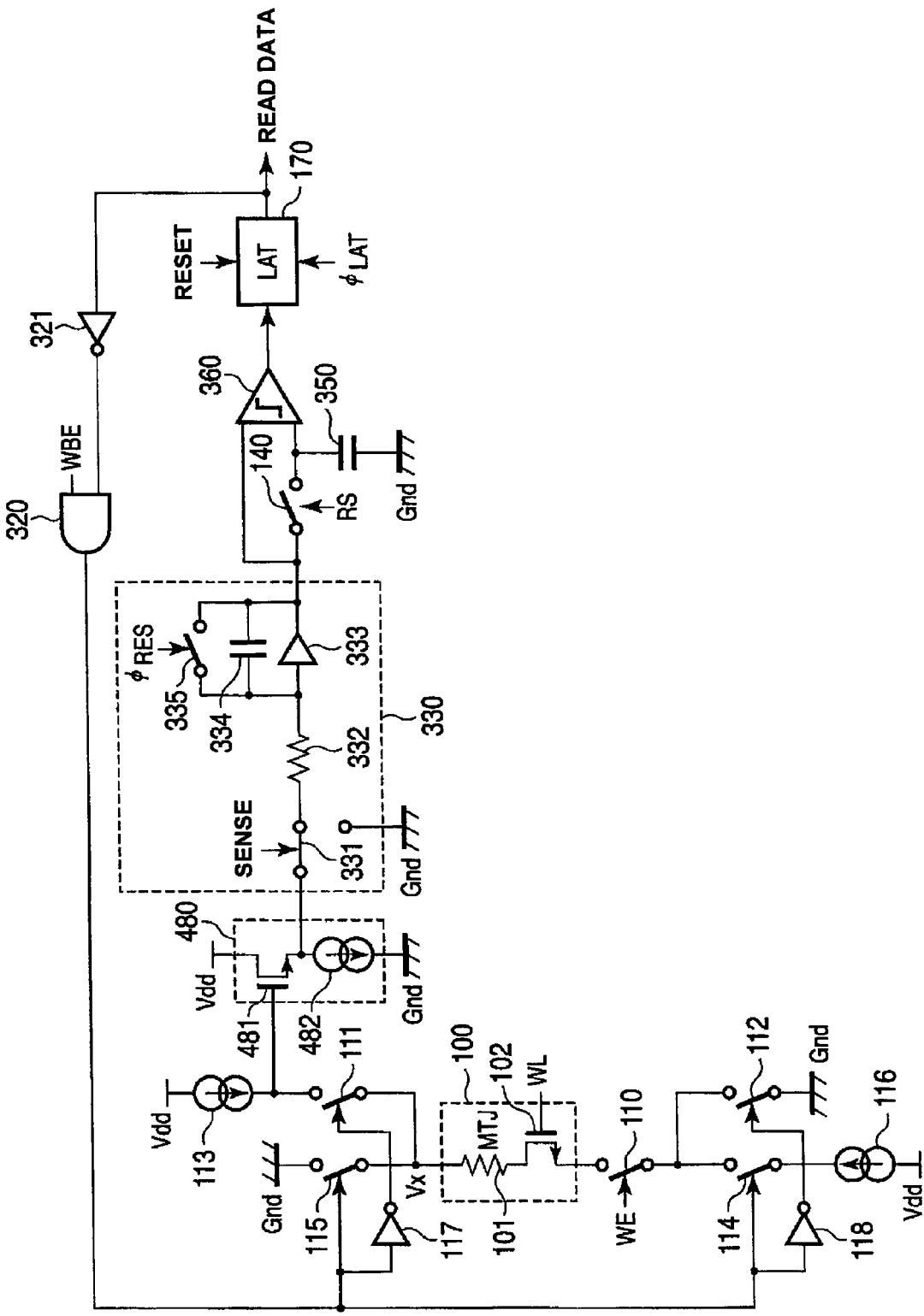
FIG. 6 is a block diagram showing a read circuit according to the fourth embodiment.

As shown in FIG. 6, the read circuit in the fourth embodiment is same as that in the third embodiment, except that an impedance converter 480 is added. Therefore, we will mainly explain the impedance converter 480 below.

The impedance converter 480 is inserted between the constant current source 113 and the integrator 330.

The impedance converter 480 includes a MOS (or NMOS) transistor 481 and a constant current source 482. The gate terminal of the MOS transistor 481 is an input terminal of the impedance converter 480. The source terminal of the MOS transistor 481 is connected to the constant current source 482. Also, the source terminal of the MOS transistor 481 is an output terminal of the impedance converter 480.

The input impedance of the impedance converter 480 is almost same as a resistance value at the gate terminal of the MOS transistor 481, and it may be high. On the other hand, the output impedance of the impedance converter 480 is almost same as a reciprocal number of a trans-conductance value of the MOS transistor 481, and it may be low, if the output impedance of the constant current source 482 is infinity. The trans-conductance is a gain of an electric current, and it is expressed as amount of change of an electric current at the drain terminal of the MOS transistor 481 against amount of change of a voltage at the gate terminal of the MOS transistor 481. Therefore, the impedance converter 480 has high input impedance and low output impedance.

According to the fourth embodiment, the amount of the split flow from the constant current sources 113 to the integrator 330 is reduced by inserting the impedance converter 480 with high input impedance and low output impedance. Therefore, the read circuit achieves fewer write error to the memory cell 100.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A read circuit for reading a data from a memory cell, comprising:
a write circuit to write the data to be stored and/or a test data to the memory cell;
a control circuit which controls the write circuit to write the test data to the memory cell in a first phase, and to write the test data which is same as the first phase to the memory cell in a second phase;

an integrator which integrates voltages at one terminal of the memory cell during the first phase to obtain a first integrated voltage, and integrates voltages at one terminal of the memory cell during the second phase to obtain a second integrated voltage;

a buffer to store the first integrated voltage; and a comparator which compares the first integrated voltage from the buffer with the second integrated voltage from the integrator to obtain the data.

2. The read circuit of claim 1, further comprising:
an impedance converter which has high input impedance and low output impedance to reduce an electric current to the integrator.

3. The read circuit of claim 1, wherein
the write circuit writes the data to be stored and/or the test data by applying an electric current which flows to a given direction based on the data to be stored and/or the test data.

4. The read circuit of claim 1, further comprising:
a constant current source which supplies an electric current to the memory cell, wherein
the write circuit writes the data to be stored and/or the test data to the memory cell by applying an external magnetic field generated by the electric current.

5. The read circuit of claim 1, wherein the integrator includes
a resistor which converts the voltage at one terminal of the memory cell to an electric current;
a capacitor which is charged by the electric current from the resistor;
an operational amplifier which outputs the first integrated voltage in the first phase and the second integrated voltage in the second phase by using the capacitor as a feedback element; and
a switch which is turned on in order to connect both terminals of the capacitor each other to reset the integrator when the first and second phases start.

6. The read circuit of claim 1, wherein
the buffer is a sample and hold circuit which samples the first integrated voltage in the first phase, and holds the first integrated voltage in the second phase.

7. The read circuit of claim 2, wherein the impedance converter includes
a MOS transistor; and
a constant electric current which is connected to the MOS transistor,
wherein
a gate terminal of the MOS transistor works as an input terminal of the impedance converter,
and a source terminal of the MOS transistor works as an output terminal of the impedance converter.

8. A method for reading a data from a memory cell, comprising:
writing a test data to the memory cell in a first phase;
integrating voltages at one terminal of the memory cell during the first phase to obtain a first integrated voltage;
writing the test data which is same as the first phase to the memory cell in a second phase;
integrating voltages at one terminal of the memory cell during the second phase to obtain a second integrated voltage; and
comparing the first integrated voltage with the second integrated voltage to obtain the data.

* * * * *